United States Patent [19]

Wickersham et al.

[11] Patent Number: 4,783,379
[45] Date of Patent: Nov. 8, 1988

[54] EXPLOSIVE CRYSTALLIZATION IN METAL/SILICON MULTILAYER FILM

[75] Inventors: Charles E. Wickersham, Columbus; John E. Poole, Grove City, both of Ohio

[73] Assignee: Tosoh SMD, Inc., Grove City, Ohio

[21] Appl. No.: 40,455

[22] Filed: Apr. 17, 1987

[51] Int. Cl.$^4$ .................. H01L 21/40; H01L 21/90; C23C 11/04

[52] U.S. Cl. .................. 428/607; 340/565; 428/635; 428/641; 437/192; 437/194; 437/200; 148/DIG. 140; 148/DIG. 147

[58] Field of Search .................. 428/607, 635, 641; 437/192, 189, 194, 200; 340/565, 566

[56] References Cited

U.S. PATENT DOCUMENTS

| | | | |
|---|---|---|---|
| 4,180,596 | 2/1979 | Crowder et al. | 427/42 |
| 4,619,035 | 10/1986 | Hotta et al. | 357/15 |
| 4,643,777 | 2/1987 | Maeda | 148/DIG. 147 |
| 4,679,310 | 7/1987 | Ramchandra et al. | 148/DIG. 147 |
| 4,707,197 | 11/1987 | Hensel et al. | 437/189 |

FOREIGN PATENT DOCUMENTS

3124420  6/1982  Fed. Rep. of Germany ...... 428/641

OTHER PUBLICATIONS

Takamori et al., "New Noncrystalline Germanium which Crystallizes "Explosively" at Room Temperature," *Appl. Phys. Lett.* 20, 201 (1972).

Mineo et al., "Velocity of Propagation in the Shock-Crystallization of Sputtered Amorphous Germanium," *Solid State Communications* 13, 329 (1983).

Wickersham et al., "Impulse Stimulated Explosive Crystallization of Sputter Deposited Amorphous (In-Ga)Sb Films," *Solid State Communications* 27, 17 (1978).

Auvert et al., "Explosive Crystallization of a-Si Films in both the Solid and Liquid Phases," *Appl. Phys. Lett.* 39(9), 724 (1981).

Koba et al., "Temperature and Thickness Effects on the Explosive Crystallization of Amorphous Germanium Films," *Appl. Phys. Lett.* 40, 672 (1982).

Wickersham et al., "Temperature Dependent Formation of Surface Undulations in Explosively Crystallized Films," *J. Vac. Sci. Technol.* A 3, 335 (1985).

Floro, "Propagation of Explosive Crystallization in Thin Rh-Si Multilayer Films" *J. Vac. Sci. Techno.* A 4(3), 631 (1986).

*Primary Examiner*—Upendra Roy
*Attorney, Agent, or Firm*—Biebel, French & Nauman

[57] ABSTRACT

The present invention provides a film comprising alternate layers of a metal such as zirconium and silicon. The film has a critical temperature at which the film can undergo explosive crystallization. The film undergoes explosive crystallization upon subjecting the film to an energy impulse at temperature equal to or greater than the critical temperature.

11 Claims, 6 Drawing Sheets

FIG-IA
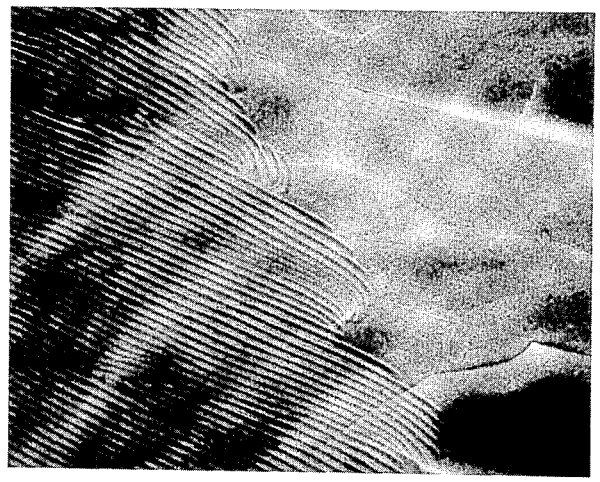
FIG-IB
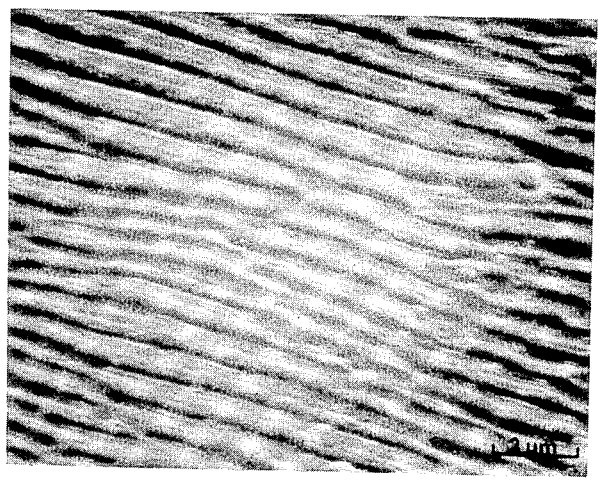

EXPLOSIVE CRYSTALLIZATION IN METAL/SILICON MULTILAYER FILM

BACKGROUND OF THE INVENTION

The present invention relates to a metal/silicon multilayer film which undergoes explosive crystallization.

Over 130 years ago, G. Gore first described explosive crystallization in amorphous antimony films. The term "explosive crystallization" describes the rapid exothermic transformation of amorphous materials into their crystalline allotropes. Since Gore's initial description of explosive crystallization, numerous researchers have described explosive crystallization. For example, see Takamori, T. et al., "New Noncrystalline Germanium which Crystallizes "Explosively" at Room Temperature," *Appl. Phys. Lett.* 20, 201 (1972); Mineo, A. et al., "Velocity of Propagation in the Shock-Crystallization of Sputtered Amorphous Germanium," *Solid State Comm.* 13, 329 (1973); Wickersham, C. E. et al., "Impulse Stimulated "Explosive" Crystallization of Sputter Deposited Amorphous (In, Ga) Sb Films," *Solid State Comm.* 27, 17 (1978); and Auvert, G. et al., "Explosive Crystallization of Alpha-Si Films in both the Solid and Liquid Phases," *Appl. Phys. Lett.* 39, 724 (1981).

However, the commercial application of the phenomenon has been limited Thick coatings have previously been used to demonstrate explosive crystallization at room temperature For example, Koba, R. et al., "Temperature and Thickness Effects on the Explosive Crystallization of Amorphous Germanium Films," *Appl. Phys. Lett.* 40, 672 (1982) reported that room temperature explosive crystallization in amorphous germanium films requires a germanium film thickness of about 20 microns. A 20 micron thick film is several times more expensive than a film which is less than 1 micron thick.

Koba, R. et al. also reported that the relationship between the film thickness and the minimum ambient temperature required for explosive crystallization had been established using a phenomenological model which had been experimentally confirmed using germanium. The model has also been experimentally confirmed using gallium doped germanium; see Wickersham, C. E. et al., *Material Lett.* 4, 268 (1986).

In this model, the energy balance condition between the heat generated by the exothermic transformation, the heat loss to the surroundings, and the heat required to continue propagation of the transformation is used to derive a relationship between the film thickness and the minimum ambient temperature for explosive crystallization. The energy balance condition gives Equation (1):

$$T^* = T' - H_c/C + (E/C) \cdot 1/\lambda$$

where $T^*$ is the critical temperature for explosive crystallization, $T'$ is the film melting point, $H_c$ is the film heat of crystallization, $C$ is the volume heat capacity of the amorphous film, $E$ is the energy/unit area lost to the surroundings during explosive crystallization, and $\lambda$ is the total film thickness prior to explosive crystallization. By measuring $\lambda$ and $T^*$ and given $T'$ and $C$, values for $H_c$ and $E$ can be obtained.

Flora, J., "Propagation of Explosive Crystallization in Thin Rh-Si Multilayer Films," *J. Vac. Sci. Technol.* A4, 631(1986) reported explosive crystallization in multilayer stacks composed of alternating layers of rhodium and silicon deposited by electron beam evaporation. The multilayer period in the Rh/Si layers studied by Flora ranged from 57.5 to 70nm. No attempt was made by Flora to optimize the multilayer period, nor was any relationship established between multilayer period and total film thickness. Furthermore, rhodium is very expensive.

DEFINITIONS

The term "ambient temperature" is used herein to refer to the temperature at which the film is used and includes applications in which the film is used at room temperature and temperatures above or below room temperature.

The term "multilayer period" as used herein means the distance between neighboring metal or silicon layers and equals the thickness of the combined metal layer and silicon layer.

SUMMARY OF THE INVENTION

The present invention provides a film comprising alternate layers of silicon and a metal selected from the group consisting of titanium, zirconium, hafnium, vanadium, niobium, tantalum, chromium, molybdenum, tugsten, iron, cobalt lead, and nickel. The layers are deposited on a substrate in amounts and thicknesses such that the film undergoes explosive crystallization at a critical temperature $T^*$ upon subjecting the film to an energy impulse.

Preferably, the multilayer period is controlled to minimize the total film thickness. It has been found that by controlling the multilayer period as taught herein, the film of the present invention can be designed to undergo explosive crystallization at lower temperatures with thinner total film thicknesses than known films. This dependency of the propensity for explosive crystallization on the multilayer period is more fully explained later.

The preferred films are films of the elements of Group IVB, VB, and VIB of the Periodic Table of the Elements. Films of the elements of Group IVB are particularly preferred.

The present invention also provides a process for explosive crystallization of a film wherein a film provided as described above is subjected to an energy impulse at or above the critical temperature $T^*$ so that the film undergoes explosive crystallization.

The film of the present invention is useful in a variety of applications. In particular, it is useful in a security device. For example, the film can be used as a detonator or to trigger an alarm signal. Films can be designed such that the energy impulses normally associated with tampering trigger explosive crystallization of the film. Upon explosive crystallization, the energy released by the film signals a device which ignites explosives to destroy the guarded article. Alternatively, the film can be used in an alarm circuit. A voltage is placed across the film so that a change in resistance occurs across the film upon explosive crystallization. This resistance change is used to signal appropriate electronic devices The film can also be used as a protective device in an optical system to prevent damage from a laser beam or to protect the eye. For example, the film can be associated with a mirrored surface in such a manner that, upon explosive crystallization of the film, the associated mirrored surface is destroyed. If a potentially damaging laser beam strikes the mirrored surface, it will trigger explosive crystallization of the film. The mirrored surface is destroyed and the optical system or the user's eye is thereby protected.

Furthermore, the change in the film which accompanies explosive crystallization is visible to the naked eye. The films can be used as visual indicators of tampering, intrusion, or the like by associating them with an object to be protected such that any movement or contact with the object crystallizes the film. Visual observation of the film will then indicate that tampering has occurred.

Thus, an object of the present invention is to provide a film which exhibits explosive crystallization at lower temperatures with thinner total film thicknesses than known films and which is therefore relatively inexpensive to prepare.

Other objects and advantages of the present invention will become apparent from the following description, attached drawings, and appended claims.

BRIEF DESCRIPTION OF THE DRAWINGS

FIG. 1A and 1B are scanning electron micrographs of an explosively crystallized Zr/Si multilayer film.

DETAILED DESCRIPTION OF THE INVENTION

Figure 2:
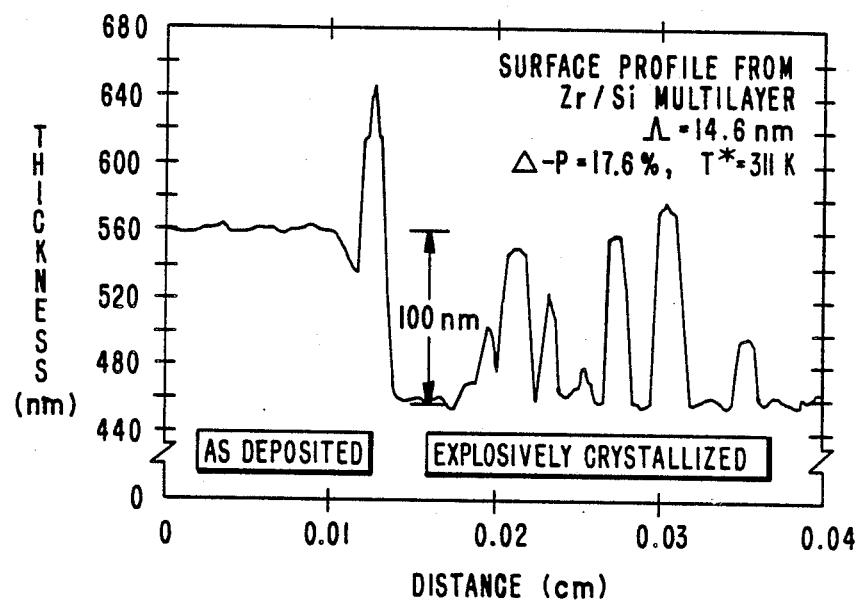
FIG. 2 is a surface profilometer scan of the region between the explosively crystallized film and the unexploded region.

The film of the present invention is preferably formed by sputtering or electron beam evaporation. The nature of the substrate upon which it is formed is not particularly critical. It can be formed on a variety of substrates including glass, plastic films, and metal, alumina, silica, and silicon supports. In one embodiment, the substrate is borosilicate glass.

As those skilled in the art know, the ejection of target material in a sputtering process is accomplished by bombarding the target surface with gas ions accelerated by high voltage. Atomic dimensioned particles are ejected from the target as a result of momentum transfer between incident ions and atoms of the target material. These particles traverse the vacuum chamber and are subsequently deposited on a substrate in the form of a thin film. To prevent evaporation in a sputtering system, the target is generally water cooled. Typically, the sputter chamber is evacuated prior to admitting the sputter gas which is normally an inert gas such as argon.

In the present invention, alternate layers of silicon and metal may be desposited using a multi-target sputtering system wherein the substrate is rotated past independently controlled metal and silicon targets. The power applied to the metal and silicon sources in the present invention is adjusted so that the metal and silicon are deposited in the desired amounts and thicknesses as specified herein.

It has been found that the film free energy increases as the multilayer period increases. At low multilayer periods, relatively large increases in free energy accompany increases in the multilayer period. As the period increases, however, a point is reached at which the increase in free energy is relatively small. On this basis, it has been determined that films having a multilayer period less than 40 nm provide the optimum balance of free energy and total film thickness.

The amounts in which the films are deposited are preferably adjusted to provide metal to silicon atomic ratios which favor the formation of metal silicides which release high amounts of energy upon crystallization. For the embodiment of the invention in which the film is made up of alternating layers of zirconium and silicon, the bilayer atomic ratio of zirconium to silicon is about 1:2. This ratio is optimal because it provides the highest heat of reaction per unit volume for silicon-zirconium films. Although the film will not be as efficient, this ratio can be varied to provide a film which is operable. If more than the optimal amount of silicon is used, a certain amount of silicon remains unreacted. If more than the optimal amount of zirconium is used, a phase such as ZrSi forms and less heat per unit volume is evolved upon crystallization as compared to $ZrSi_2$.

Useful sputtering conditions for the preparation of the zirconium-silicon films of the present invention are summarized in Table 1 below.

TABLE 1

| Condition | Zr | Si |
|---|---|---|
| Target Voltage (V) | 270 | 490 |
| Target Current (amps) | 0.28 | 0.33 |
| Argon Pressure (Pa) | 0.8 | 0.8 |
| Target Diameter (cm) | 5 | 5 |
| Target-Substrate Separation (cm) | 5.7 | 5.7 |
| Target Erosion Area ($cm^2$) | 11.5 | 11.5 |
| Target Power Density (Watts/$cm^2$) | 6.6 | 14.1 |
| Target Purity | 99.9% | 99.999% |
| Base Chamber Pressure (Pa) | $4 \times 10^{-5}$ | $4 \times 10^{-5}$ |
| Stationary Deposition Rate (nm/sec) | 1.17 | 2.33 |
| Rotating Deposition Rate (nm/sec) | 0.2 | 0.33 |

Using these parameters, the deposition time is from about 10 to 125 minutes with substrate rotation rates from about 1 to 4 rpm.

FIG. 1A and 1B show a pair of scanning electron micrographs of a 2.4 microns thick Zr/Si multilayer film after explosive crystallization at 300° K. The hispidulous surface characteristic of explosive crystallization is easily seen. The micrograph in FIG. 1A shows the region where the explosive crystallization transformation stopped. The right side is the unexploded amorphous Zr/Si multilayer film while the left side is explosively transformed material. It is believed the explosive transformation stopped propagating in the film because the film thickness at the particular point fell below the critical value required to sustain an explosive crystallization transformation at 300° K. The deposited film thickness fell from its peak value of 2.4 microns in the substrate center to less than 1.2 microns a distance of 3.8 cm from the substrate center.

A higher magnification view of the explosively crystallized region is shown in FIG. 1B. The distance between raised areas is approximately 710 nm which is slightly smaller than the 900 nm separation observed in amorphous germanium films.

A measurement of the film surface roughness across the interface between the explosively crystallized region and an unexploded region is shown in FIG. 2. The distance in cm across the film surface was plotted on the x-axis while the film thickness in nm was plotted on the y-axis. The film period was 14.6 nm and the critical temperature for explosive crystallization was 311° K. Clearly, the explosively crystallized area was roughened by the transformation. The thickness of the explosively crystallized region was measurably thinner than the non-transformed region. Measurements of this thickness difference and the total film thickness led to the conclusion that during the transformation, the film density increased by about 18% which is consistent with the change in film density expected as the multilayer film transforms from isolated layers of zirconium and silicon into homogeneous $ZrSi_2$. From Table 2 below, the difference in density between a zirconium/silicon multilayer film and $ZrSi_2$ is approximately 20%. It should be noted that this abrupt change in density puts the film under a stress which can cause film delamination or in some cases, when film adhesion is particularly strong, the fracture of the underlying glass substrate.

Figure 7:
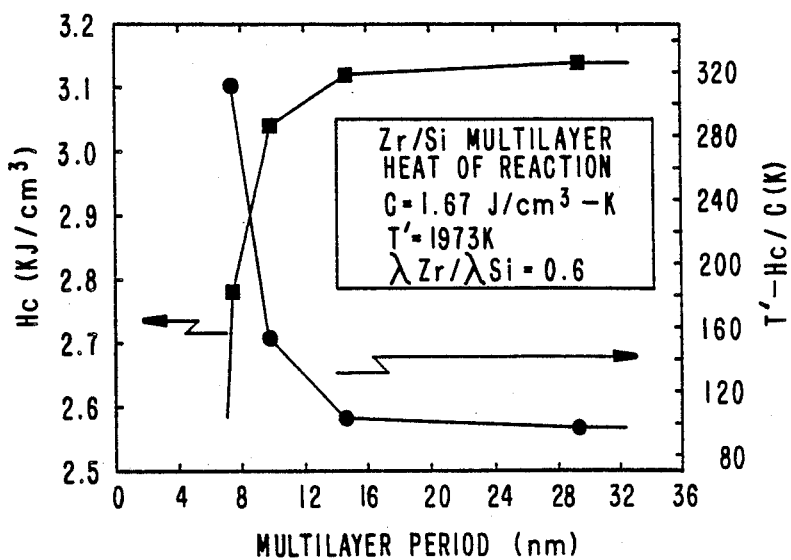
FIG. 7 shows the variation of the heat of crystallization for Zr/Si multilayers as determined from the explosive crystallization kinetics with multilayer period.

It has been found that the multilayer period affects the film free energy (Hc) as shown in FIG. 7. As a result of the higher free energy of a film having a large multilayer period, the film undergoes explosive crystallization at lower temperatures with thinner total film thicknesses than known films. While this is shown for zirconium-silicon films, it is also true for the other metals listed above.

With reference to FIG. 7, as the period increases up to about 14.6 nm, Hc increases. This contributes to a lower T* under Equation (1) above. When the period exceeds about 14.6 nm though, Hc does not increase as it does in the period range up to 14.6 nm and the benefit derived from further increasing the period is less. Thus, little value is seen in films having multilayer periods greater than 30 or 40 nm based on FIG. 7. It should be noted that in the extreme case where the period is extremely large, the layers can be too thick to undergo explosive crystallization; instead, the layers act as heat sinks and do not participate in the reaction.

On the other hand, theoretically some benefit in terms of film free energy is achieved regardless of how small the multilayer period may be. In the extreme case, comparing a homogeneous system to a layered system wherein the period is only a few angstroms, the layered system will give a more negative free energy change.

The total film thickness required for explosive crystallization at a predetermined temperature is inversely proportional to the multilayer period. In other words, as the multilayer period increases, the total film thickness required for explosive crystallization at a specific temperature decreases. In zirconium-silicon films, a multilayer period of about 5.0 nm requires a total film thickness of about 10 microns for explosive crystallization to occur at room temperature whereas the minimum total film thickness required for a period of about 30.0 nm is about 0.3 microns.

The stability of the film at ambient temperature can be controlled by controlling the total film thickness and multilayer period under Equation (1) above. Films can be designed as tamper indicators such that slight vibrations will set off the explosive crystallization of a film at room temperature. For other applications, such as in protecting optical systems, room temperature sensitivity will not be required. For most applications, the film will have a total thickness less than about 10 microns, and more preferably, less than about 1.0 micron, and still more preferably, less than 0.5 micron considering the expense and instability of thicker films. A surface profilometer is useful for measuring film thickness.

For some applications, the film will exhibit a critical temperature for explosive crystallization near room temperature. Film thickness and cost can be reduced, however, by using thinner films having higher critical temperatures. In those applications in which the critical temperature is above room temperature, the film can be heated to its critical temperature by a thin film heater. For applications in refrigerated environments, films can be designed with critical temperatures lower than room temperature.

Preferably, the critical temperature for explosive crystallization is high enough that the film can be readily manufactured and handled at room temperature and low enough that the film can be easily heated to its critical crystallization temperature. Preferably, the critical temperature for explosive crystallization ranges from about 25° to 120° C. Films having T* near or lower than room temperature may have to be manufactured and handled in a refrigerated environment.

The multilayer period and the total film thickness are related to T* as discussed above. In order to provide the foregoing range for T*, the multilayer period preferably ranges from about 5 to 30 nm and the total film thickness is about 0.3 to 10 microns. As mentioned earlier, room temperature explosive crystallization in amorphous germanium films requires a total germanium film thickness of about 20 microns. Thus, the present invention provides a film having a total thickness which can be fifty times less than that presently required for explosive crystallization.

In depositing the various layers making up the film, it is generally desirable to deposit the layers as uniformly as possible. As the thickness of the film or the thickness of an individual layer varies, the free energy of the film at that point will also vary. This variation in the film can be tolerated provided that the film is capable of undergoing self-propagating crystallization at the temperature of its designed use.

Figure 6:
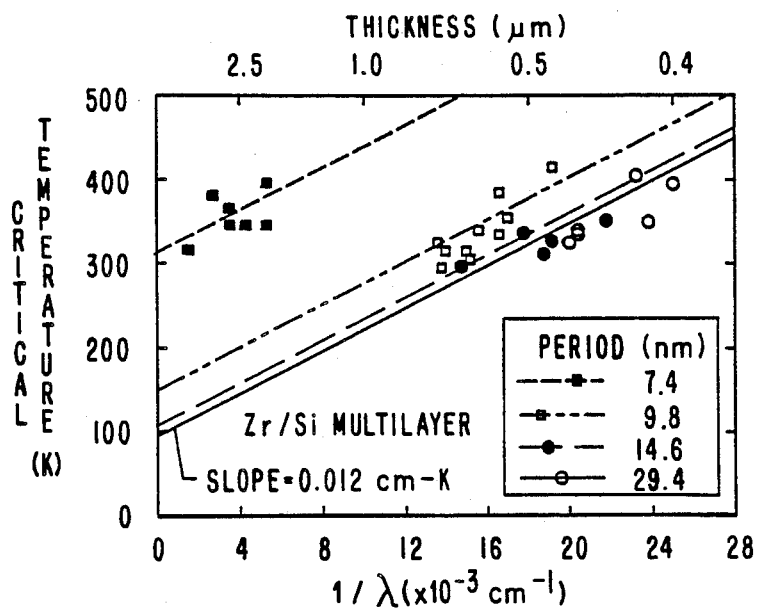
FIG. 6 shows critical temperatures for explosive crystallization of Zr/Si multilayer films as a function of the total film thickness.

In order to study the effect of the multilayer period on the propensity for explosive crystallization, a series of zirconium-silicon film samples were prepared and values for T* and λ were measured for each sample. This data is shown in FIG. 6. 1/λ in terms of $10^{-3}$ $cm^{-1}$ was plotted on the bottom x-axis while the critical temperature, T*, in °K. was plotted on the y-axis. The decreasing film thickness in microns was also plotted in decreasing order along the top x-axis. As expected from Equation (1) above, a linear relationship is observed between the critical temperature, T*, and the inverse film thickness, 1/λ. The slope of the plots which is equal to E/C in Equation (1) remained within experimental error unchanged at 0.012 cm/°K. as the period of the multilayer stack increased. If C is taken to be 1.67 $J/cm^3$, which is the weighted average for the Zr/Si multilayer film as shown in Table 2 below, then the energy loss, E, during the transformation is 0.02 $J/cm^2$. This E value is 4.5 times smaller than the E value of 0.09 $J/cm^2$ reported by Koba, R. et al., for the explosive crystallization in germanium.

One explanation for the difference in the heat loss between germanium and Zr/Si multilayers is that the major heat loss mechanism during explosive crystallization is by back diffusion of heat from the crystallization front into the crystalline transformed region. Assuming that this is the case, then the approximately 3.75 times lower thermal conductivity of the ZrSi$_2$ and the 18% smaller cross section of the transformed ZrSi$_2$ arising from the density change would be expected to yield an approximately 4.6 times lower rate of heat loss. The good agreement between the rough calculation and the observed difference indicates that this approach may be a reasonable explanation for the heat loss term in Equation (1) above. However, more careful experiments are required to unambiguously establish the heat loss mechanism.

The Y-axis intercepts of the plots of FIG. 6 decrease with increasing multilayer period. This result is also shown in FIG. 7 where the intercept in Equation (1), $T'-H_C/C$, in °K. is plotted on the right Y-axis as a function of multilayer period in nm which is plotted on the X-axis. The data in FIG. 7 was used to obtain an estimate for the value of $H_c$ by assuming that $T'$ is equal to the melting point of ZrSi$_2$ which as shown in Table 2 below is 1973°K. and C is equal to the weighted average of the values for zirconium and silicon which as shown in Table 2 below is 1.67 J/cm$^3$. If the assumptions that $T'$ and C are independent of the multilayer period are correct, the data shown in FIG. 7 leads to the conclusion that the period of the multilayer stack is affecting the total free energy of the film. The total free energy of the film, Hc, in °K. J/cm$^3$ is plotted on the left Y-axis. The plot shows that as the multilayer period increases, the total free energy increases.

One explanation for the observed decrease in Hc with decreasing multilayer period is that the interfacial region between the zirconium and silicon layers has reacted prior to the explosive transformation so that the total free energy of the system is lower. Thus, in a system with a small multilayer period, i.e., a large number of interfaces per unit volume, the total energy content, once the reaction is initiated, is lowered. Thus, a longer period film has fewer interfaces and so for a given volume of material, has a higher energy content once the reaction is initiated. This higher energy content makes possible the observance of explosive crystallization at lower temperatures and thinner total film thicknesses.

The as-deposited multilayer films are heated (when necessary) to the critical temperature and subjected to an energy pulse such that the films undergo explosive crystallization. In the laboratory, the multilayer films are explosively crystallized by heating the films on a hot plate with a chromel-alumel thermocouple attached and periodically striking the films with a sharp tungsten carbide tipped stylus until the transformation is observed.

Table 2 below summarizes the physical properties of the materials of the present invention and is useful for the following discussion. The values for Zr/Si in Table 2 were calculated by using the values for Zr and Si and a layer thickness ratio (Zr:Si) of 0.583.

TABLE 2

| System | Property | | | |
|---|---|---|---|---|
| | Density (g/cm3) | Heat Capacity (J/cm3-K) | Thermal Conductivity (W/cm-K) | Melting Point (K.) |
| Zr | 6.49 | 1.82 | 0.883 | 2125 |
| Si | 2.33 | 1.58 | 0.837 | 1683 |
| Zr/Si | 3.86 | 1.67 | 0.854 | n/a |
| ZrSi$_2$ | 4.86 | | 0.156 | 1973 |
| Ge | 5.32 | 1.65 | 0.586 | 1210 |

As-deposited, annealed, and explosively crystallized samples were examined using x-ray diffraction and scanning electron microscopy. X-ray diffraction scans of the samples for 2 $\theta$ values ranging from 20° to 100° were used to determine the crystal structure of the multilayer films. Small angle x-ray diffractions patterns with 2 $\theta$ ranging from 0.4 to 7° were used to measure the superlattice reflections around the (000) beam.

As a preface to the discussion of the x-ray diffraction patterns of the present invention, superlattice reflections, i.e., reflections resulting from an ordered structure, in multilayer films have been used to study diffusion and coherency in the multilayer thin films. The superlattice reflections about the (000) beam are observed in artificially layered films when the Bragg condition is satisfied.

$$\Lambda = n\lambda_x/2 \sin \theta_n$$

where $\Lambda$ is the period of the multilayer, n is an integer representing the order of the reflection, $\theta_n$ is the measured Bragg angle for the n$^{th}$ order superlattice line, and $\lambda_x$ is the x-ray wavelength. The multilayer period is obtained from the measured values of $\theta_n$.

The intensity of the superlattice reflections can be used to estimate the shape of the composition modulation at the interface between layers. The term "composition modulation" as used herein refers to the variation in composition as a function of film distance. It has been shown that the intensity of the higher order superlattice reflections is related to the square of the Fourier coefficients of the multilayer composition profile. As those skilled in the art know, because the electron density of a crystal is a periodic function of position, a crystal can be described analytically by means of a Fourier series which is the sum of an infinite number of harmonics, each suitably weighted by a Fourier coefficient. Thus, the presence of higher order reflections in a diffraction pattern is an indication that the composition modulation interface between the multilayers has retained some squareness.

As diffusion occurs between the two materials making up the multilayer film, the square composition modulation rapidly decays into a sinusoidal modulation and the intensity of the higher order superlattice reflections rapidly disappears. A composition modulation in the form of a single sine wave has a single superlattice reflection (n=1) corresponding to the sine wave frequency while a square modulation exhibits higher order superlattice reflections (n=1,2,3 ...) corresponding to its higher order Fourier coefficients.

A step counting technique with a step of 0.05° and dwell time at each step of 10 seconds was used to obtain the small angle diffraction patterns. Copper K$\alpha$ x-ray radiation was used in all the x-ray diffraction measurements.

Figure 3:
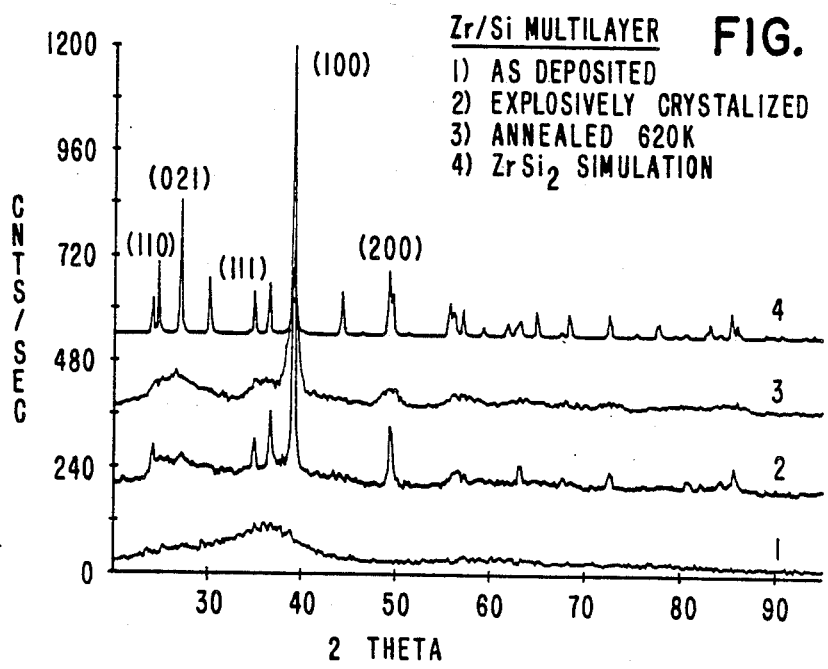
FIG. 3 shows x-ray diffraction patterns

X-ray diffraction patterns from as-deposited Zr/Si multilayers, explosively crystallized Zr/Si multilayers, a Zr/Si multilayer stack annealed at 590° K. for 30 minutes, and the standard diffraction pattern for ZrSi$_2$ are provided in FIG. 3. $2\theta$ was plotted on the x-axis while the intensity in counts/sec was plotted on the y-axis. The pattern for the as-deposited film indicates that the initial multilayer film is amorphous. The annealed film non-explosively transformed to ZrSi$_2$. However, film delamination often results even in non-explosively transformed films because a volume change accompanies the reaction and crystallization. A strong ZrSi$_2$ diffraction pattern is observed in the explosively crystallized film and no free zirconium or silicon lines are detected.

Figure 4:
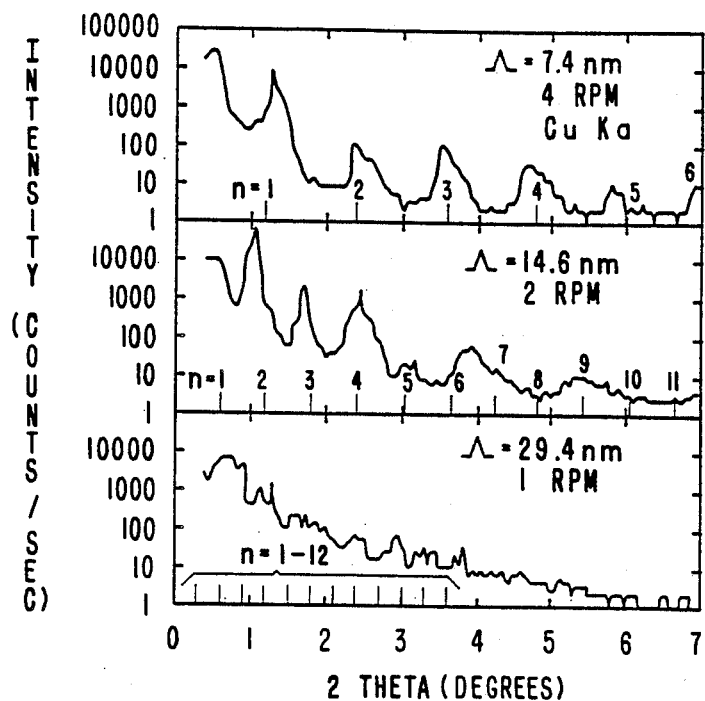
FIG. 4 shows superlattice reflections from amorphous Zr/Si multilayer films prior to explosive crystallization.

A series of Zr/Si multilayer films were deposited with a constant atomic ratio of the zirconium to silicon of about 1:2 with total film thicknesses from 0.3 to 10 microns for periods of 7.4, 14.6, and 29.4 nm. Small angle x-ray diffraction was used to determine the period of the as-deposited films. FIG. 4 shows the results. Again, $2\theta$ in degrees was plotted on the x-axis while intensity in counts/sec was plotted on the y-axis. The large number of higher order reflections observed indicates that the composition modulation in the as-deposited films is very square with little intermixing between the zirconium and silicon layers prior to explosive crystallization. Calculated $2\theta$ positions for the $n^{th}$ order reflections based upon the given values for the period are indicated by the long vertical lines intersecting the abscissa in FIG. 4. The measured periods were about 8% smaller than the values expected from the deposition rate measurements. This discrepancy may be due to a change in the zirconium and silicon film density when they are layered.

Figure 5:
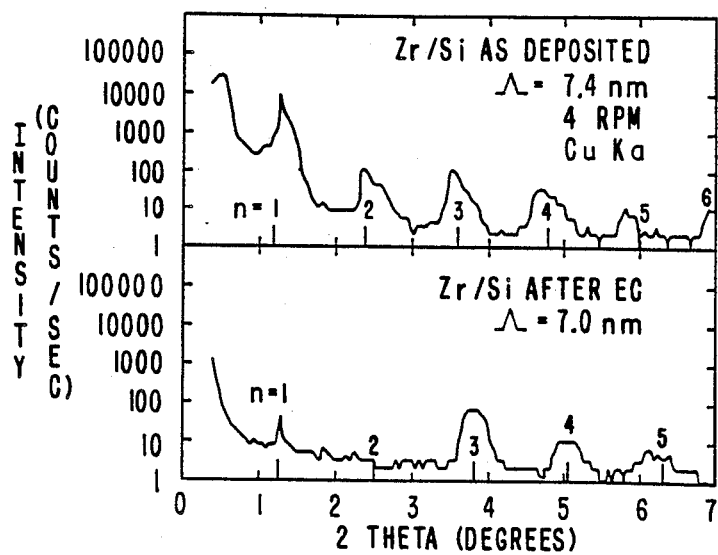
FIG. 5 shows superlattice reflections from a Zr/Si multilayer film before and after explosive crystallization.

Small angle diffraction patterns were also obtained from a film with a 7.4 nm period as-deposited and after explosive crystallization as shown in FIG. 5. Again, $2\theta$ in degrees was plotted on the x-axis while intensity in counts/sec was plotted on the y-axis. Prior to explosive transformation, the film exhibited relatively intense superlattice reflections as shown in the upper curve in FIG. 5. The small angle diffraction pattern obtained from this film after explosive crystallization is shown in the bottom pattern in FIG. 5. The presence of the first and third order reflections indicates that some periodicity is retained by the film after explosive crystallization. The shift in the position of the superlattice reflections with respect to their position prior to explosive crystallization indicates that explosive crystallization reduces the sample period to 7.0 nm or by about 5.5%. The significantly lower intensity of the superlattice reflections and the disappearance of the second order reflection indicate that the composition modulation after explosive crystallization has a smaller amplitude and is more sinusoidal than prior to explosive transformation. However, it is not clear why the second order reflection disappears while the fourth order peak intensity remains relatively unchanged.

Figure 8:
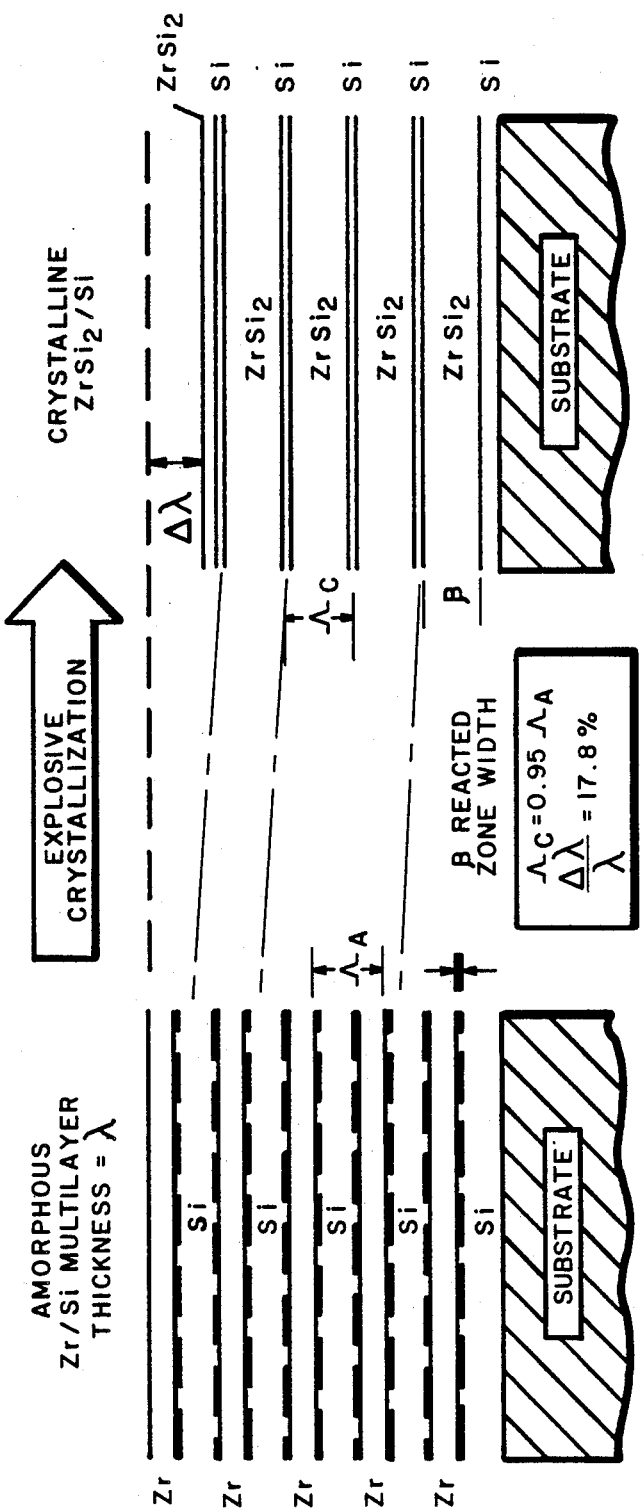
FIG. 8 shows a schematic diagram of the reaction model used to explain the variation in the heat of crystallization with multilayer period.

A schematic diagram of the reaction model is illustrated in FIG. 8. On the left side of FIG. 8, a multilayer film is illustrated comprising a substrate having alternate layers of amorphous metallic silicon and zirconium thereon. $\lambda$ is the total multilayer film thickness. $\Lambda_A$ is the period which is the distance between neighboring as-deposited zirconium or silicon layers. On the right side of FIG. 8, an explosively crystallized film having alternate layers of ZrSi$_2$ and Si is illustrated. $\Lambda_c$ is the period of the explosively crystallized film and is the distance between neighboring layers of ZrSi$_2$ or Si. An interfacial layer of thickness $\beta$ forms at each Zr/Si interface. Comparing the uncrystallized to the crystallized film, $\Delta\lambda$ is the change in the multilayer film thickness. $\Delta\lambda/\lambda$ is 17.8%.

Figure 9:
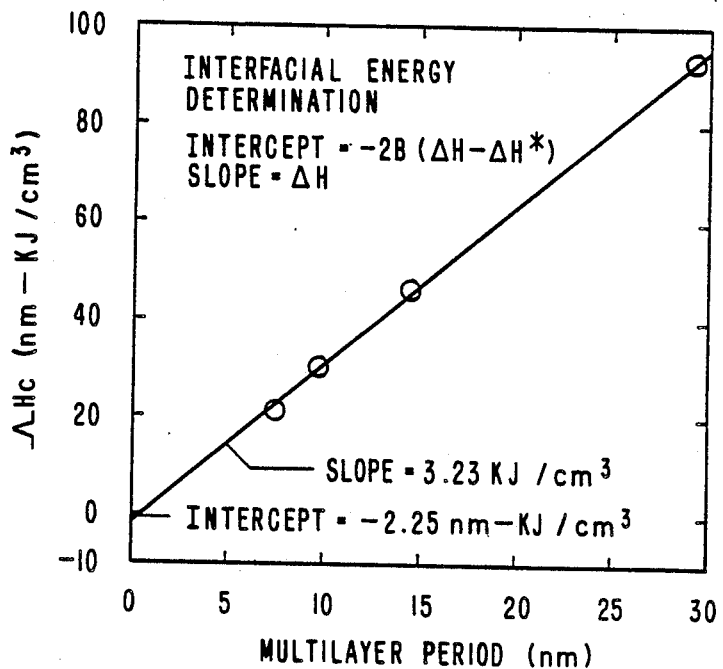
FIG. 9 shows the variation of the surface free energy with the multilayer period.

The free energy available for supporting the exothermic reaction between the zirconium and silicon in the interfacial region is given by $\Delta H^*$ where the reaction free energy between zirconium and silicon outside the interfacial region is $\Delta H$. Thus, the total energy available to support the explosive crystallization reaction in each period of the multilayer is given by:

$$\Lambda \cdot (Hc) = \Lambda \cdot \Delta H - 2 \cdot \beta (\Delta H - \Delta H^*)$$

where $\Lambda$ is the period of the multilayer, Hc is the film heat of crystallization, $\Delta H$ is the reaction free energy between zirconium and silicon outside of the interfacial region, $\beta$ is the interfacial layer thickness, and $\Delta H^*$ is the free energy available for supporting the exothermic reaction between the zirconium and the silicon in the interfacial region. Assuming that this model is correct, a plot of $\Lambda \cdot Hc$ versus $\Lambda$ should give a straight line with a slope of $\Delta H$ and an intercept of $-2 \cdot \beta(\Delta H - \Delta H^*)$. The intercept value further provides a relationship between the reaction zone thickness, $\beta$, and the reaction zone free energy, $\Delta H^*$. The multilayer period, $\Lambda$, in nm was plotted on the X-axis while $\Lambda$ Hc in nm $-$K J/cm$^3$ was plotted on the Y-axis in FIG. 9. A linear relationship is found with a value for $\Delta H$ of 3.23° K J/cm$^3$ and an intercept of $-2.25$ nm$-$K J/cm$^3$. Using these values for the intercept and slope gives:

$$\beta = 1.125/(\Delta H - \Delta H^*)$$

where $\beta$ is in nm and $\Delta H$ and $\Delta H^*$ are in °K. J/cm$^3$. Assuming that $\Delta H^*$ is 0, $\beta$ is 0.35 nm which is in excellent agreement with the C-axis lattice spacing in orthorhombic ZrSi$_2$ of 0.367 nm. Consequently, the observed variation of the propensity for explosive crystallization to decrease with decreasing multilayer period can be explained by the reduction in system free energy which occurs upon formation of Zr-Si bonds at Zr/Si interfaces.

FIG. 8 illustrates additional effects which occur upon the explosive crystallization of the amorphous multilayer films. The large reduction in film density which occurs when the isolated layers of zirconium and silicon react to form ZrSi$_2$, causes the period of the remaining multilayer to decrease by about 5%. This shift in period was observed in FIG. 5. The existence of a periodic multilayer remnant in the film after explosive crystallization is surprising. It is expected that the multilayer explosive crystallization is similar to that shown in FIG. 8. If a slight excess of silicon exists in the multilayer film or if the layer separation exceeds a certain distance, free silicon layers could remain after explosive transformation. These layers would give rise to the superlattice reflections similar to those shown in FIG. 5. It should be noted that films which exhibited no superlattice reflections after explosive crystallization were also produced. No systematic examination of which films exhibited superlattice reflections after explosive crystallization has yet been attempted The value obtained for the heat of reaction for the Zr/Si multilayer films was 3.88° K J/cm$^3$ which was based on the reaction product volume rather than the reaction precursor volume and is about 25% less than the accepted value for the heat of formation for $ZrSi_2$ of 5.23° K J/cm$^3$. Possible explanations for this discrepancy include the choice of T' and the fact that the heat of melting was neglected in the calculations. When properly taking these factors into account, it is likely that a better agreement between the estimate between Hc and the accepted value for the heat of formation could be obtained.

Having described the invention in detail and by reference to preferred embodiments thereof, it will be apparent that modifications and variations are possible without departing from the scope of the invention defined in the appended claims.

What is claimed is:

1. A film capable of undergoing explosive crystallization when subjected to an energy impulse at a temperature equal to or greater than its critical temperature for explosive crystallization said film comprising a plurality of alternate layers of amorphous silicon and a metal selected from the group consisting of titanium, zirconium, hafnium, vanadium, niobium, tantalum, chromium, molybdenum, tungsten, iron, cobalt, nickel, ruthenium, rhodium, lead, osmium, iridium, and platinum, said film having a multilayer period of about 5 to 30 nm and having a critical temperature for explosive crystallization of from about 25° to 125° C.

2. The film of claim 1 wherein said film has total thickness less than 10 microns.

3. Detonator comprising the film of claim 1.

4. Security device comprising the film of claim 1.

5. Alarm circuit comprising the film of claim 1.

6. The film of claim 2 wherein said film has a total thickness less than 1 micron.

7. The film of claim 6 wherein said metal is selected from the group consisting of titanium, zirconium, hafnium, iron, cobalt and nickel.

8. The film of claim 7 wherein said metal is selected from the group consisting of titanium, zirconium and hafnium.

9. A film capable of undergoing explosive crystallization when subjected to an energy impulse at a temperature equal to or greater than its critical temperature for explosive crystallization said film comprising a plurality of alternate layers of zirconium and amorphous silicon said film having a multilayer period of about 5 to 30 nm and having a critical temperature for explosive crystallization of from about 25° to 125° C.

10. The film of cliam 9 wherein said film has a total thickness less than about 10 microns.

11. The film of claim 10 wherein said zirconium and silicon are deposited in bilayer amounts and thicknesses such that the atomic ratio of zirconium to silicon in said film is about 1:2.

* * * * *